US010065395B2

(12) United States Patent
Matsushita et al.

(10) Patent No.: US 10,065,395 B2
(45) Date of Patent: Sep. 4, 2018

(54) COMPOSITE SUBSTRATE AND METHOD FOR MANUFACTURING SAME

(71) Applicant: KYOCERA Corporation, Kyoto-shi, Kyoto (JP)

(72) Inventors: Hideki Matsushita, Yasu (JP); Masanobu Kitada, Kyoto (JP); Tetsuhiro Osaki, Hikone (JP)

(73) Assignee: KYOCERA CORPORATION, Kyoto (JP)

( * ) Notice: Subject to any disclaimer, the term of this patent is extended or adjusted under 35 U.S.C. 154(b) by 435 days.

(21) Appl. No.: 14/894,045

(22) PCT Filed: May 29, 2014

(86) PCT No.: PCT/JP2014/064276
§ 371 (c)(1),
(2) Date: Nov. 25, 2015

(87) PCT Pub. No.: WO2014/192873
PCT Pub. Date: Dec. 4, 2014

(65) Prior Publication Data
US 2016/0101598 A1 Apr. 14, 2016

(30) Foreign Application Priority Data

May 31, 2013 (JP) .................. 2013-115183
Mar. 26, 2014 (JP) .................. 2014-063552

(51) Int. Cl.
B32B 9/04 (2006.01)
H01L 21/263 (2006.01)
H01L 21/763 (2006.01)
(Continued)

(52) U.S. Cl.
CPC .............. B32B 9/04 (2013.01); B23K 20/00 (2013.01); B32B 9/041 (2013.01); H01L 21/187 (2013.01);
(Continued)

(58) Field of Classification Search
CPC ....... B32B 9/04; B32B 9/041; B32B 2457/14; H01L 21/76251; H01L 21/263;
(Continued)

(56) References Cited

U.S. PATENT DOCUMENTS 9,754,815 B2 * 9/2017 Matsushita ............ B23K 20/00
9,773,678 B2 * 9/2017 Imaoka ............. H01L 21/26506
(Continued)

FOREIGN PATENT DOCUMENTS

JP 2004-343359 A 12/2004
JP 2010-278337 A 12/2010

OTHER PUBLICATIONS

Howlander et al., "A novel bonding method for ionic wafers", IEEE Transactions on Advanced Packaging, vol. 30, No. 4, 2007, pp. 598-604.*
(Continued)

Primary Examiner — Jonathan C Langman
(74) Attorney, Agent, or Firm — Volpe and Koenig, P.C.

(57) ABSTRACT

A composite substrate comprising a monocrystalline support substrate made of an insulating material and a monocrystalline semiconductor part disposed as a layer on the upper surface of the support substrate. An interface region having a thickness of 5 nm from the bonding interface between the support substrate and the semiconductor part towards the semiconductor part side includes a metal comprising: a metal element excluding the materials constituting the main components of the support substrate and the semiconductor part; and an inert element selected from the group consisting of Ar, Ne, Xe, and Kr. The number of atoms per unit area of the inert element is greater than that of the metal and smaller than that of the element constituting the semiconductor part.

13 Claims, 7 Drawing Sheets

(51) Int. Cl.
  *H01L 29/06*    (2006.01)
  *B23K 20/00*    (2006.01)
  *H01L 21/18*    (2006.01)
  *H01L 29/786*   (2006.01)
  *H01L 21/762*   (2006.01)

(52) U.S. Cl.
  CPC ...... *H01L 21/263* (2013.01); *H01L 21/76251* (2013.01); *H01L 29/0649* (2013.01); *H01L 29/78603* (2013.01); *H01L 29/78657* (2013.01); *B32B 2457/14* (2013.01)

(58) Field of Classification Search
  CPC ........... H01L 29/0649; H01L 29/78603; H01L 29/78657; H01L 21/187; B23K 20/00
  See application file for complete search history.

(56) References Cited

U.S. PATENT DOCUMENTS

| | | | |
|---|---|---|---|
| 9,837,374 B2 * | 12/2017 | Matsushita | C23C 14/18 |
| 2014/0037945 A1 * | 2/2014 | Suga | B23K 1/20 |
| | | | 428/336 |
| 2014/0048805 A1 * | 2/2014 | Suga | B23K 1/20 |
| | | | 257/51 |

OTHER PUBLICATIONS

International Search Report (Form PCT/ISA/210) dated Sep. 9, 2014 and issued for International Application No. PCT/JP2014/064276.

* cited by examiner

COMPOSITE SUBSTRATE AND METHOD FOR MANUFACTURING SAME

TECHNICAL FIELD

The present invention pertains to a composite substrate and a method for manufacturing the same, the composite substrate including a layered semiconductor part on an insulated substrate that is the base.

BACKGROUND

In recent years, development of technology to reduce parasitic capacitance in order to enhance the performance of semiconductor elements has progressed. A Silicon on Sapphire (SOS) structure is a structure for achieving the technology to reduce this parasitic capacitance. A method for forming the SOS structure is described in Japanese Unexamined Patent Application Publication No. 2010-278337A and in Japanese Unexamined Patent Application Publication No. 2004-343359A. In Japanese Unexamined Patent Application Publication No. 2010-278337A, the SOS structure is formed by bonding a sapphire substrate and a Si layer intermediated by an oxide film. In addition, in Japanese Unexamined Patent Application Publication No. 2004-343359A, the surfaces of two substrates made of different materials are activated with an ion beam or a Fast Atom Beam (FAB) gun and then joined intermediated by an intermediate layer containing a metal.

SUMMARY OF THE INVENTION

Problems to be Solved by the Invention

However, the SOS structure obtained using the method described in Japanese Unexamined Patent Application Publication No. 2010-278337A or Japanese Unexamined Patent Application Publication No. 2004-343359A has an amorphous intermediate layer between the Si layer and the sapphire substrate. A reduction in heat radiation, a formation of unintentional parasitic capacitance, or the like occurs due to this intermediate layer, and there is concern that a problem may occur in the operation of manufactured semiconductor elements.

The present invention is conceived on the basis of the above circumstances, and an object thereof is to provide a composite substrate and a method for manufacturing the same wherein the composite substrate is made to be highly reliable by eliminating the intermediate layer.

Means to Solved the Problem

A composite substrate according to one embodiment of the present invention includes a monocrystalline support substrate made of an insulating material and a monocrystalline semiconductor part disposed as a layer on the top face of the support substrate. Furthermore, any one of a metal made from a metal element excluding materials constituting the main components of the support substrate and the semiconductor part and an inert element selected from the group consisting of Ar, Ne, Xe, and Kr are contained in a 5 nm thick interface region from a bonding face of the support substrate and the semiconductor part toward the semiconductor part. The number of atoms per unit area of the inert element is greater than that of the metal and less than that of the element constituting the semiconductor part.

A method for manufacturing the composite substrate according to one embodiment of the present invention includes a steps of: preparing, activating, supplying a metal, supplying an inert element, bonding, thinning, and heating.

In the step of preparing, a monocrystalline support substrate made of an insulating material and a monocrystalline semiconductor substrate made of a material having an etching rate for dry etching different than that of the support substrate are prepared.

In the step of activating, a main face of the support substrate and a main face of the semiconductor substrate are activated by irradiating both main faces with a FAB gun.

In the step of supplying the metal, a metal made from a metal element excluding the materials constituting the main components of the support substrate and the semiconductor part is supplied to at least one of the main face of the activated support substrate and the main face of the activated semiconductor substrate.

In the step of supplying the inert element, an inert element selected from the group consisting of Ar, Ne, Xe, and Kr is supplied to at least one of the activated main face of the support substrate and the activated main face of the semiconductor substrate in an amount such that the number of inert element atoms per unit area is greater than the number of atoms per unit area of the metal and is less than the number of atoms per unit area of the element constituting a crystal face exposed to the main face of the semiconductor substrate.

In the step of bonding, the activated main face of the support substrate supplied with the metal or the inert element and the activated main face of the semiconductor substrate supplied with the metal or the inert element are bonded by being brought into contact at normal temperature.

In the step of thinning, the semiconductor substrate is made into a layered semiconductor part by thinning the semiconductor substrate from a second main face of the semiconductor substrate.

In the step of heating, the semiconductor part and the support substrate are heated to a temperature higher than a eutectic temperature of the metal and the material constituting the semiconductor part.

Effects of the Invention

According to the present invention, a composite substrate with a support substrate bonded to a semiconductor part without an intermediate layer therebetween can be obtained. In addition, a method for manufacturing a composite substrate by bonding the support substrate to the semiconductor part without the intermediate layer therebetween can be provided.

BEST MODE FOR CARRYING OUT THE INVENTION (Composite Substrate)

An example of an embodiment of a composite substrate of the present invention is described with reference to the drawings.

Figure 1A:
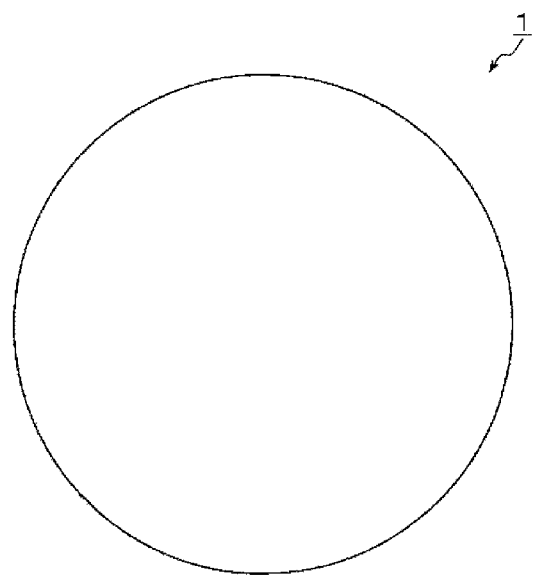
FIG. 1A is a plan view illustrating a schematic configuration of a composite substrate according to one embodiment of the present invention.
Figure 1B:
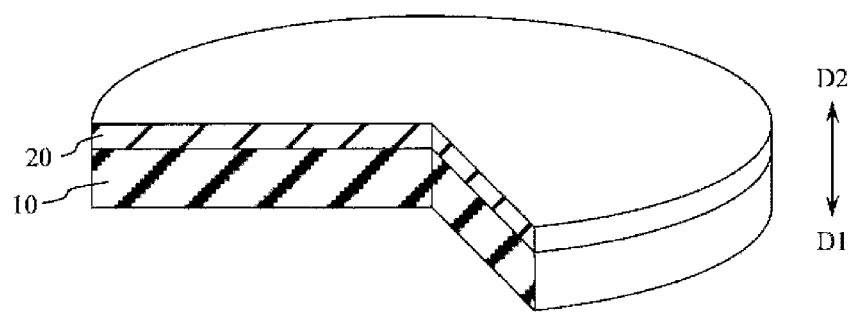
FIG. 1B is a partial cross-sectional perspective view of the composite substrate.
Figure 1C:
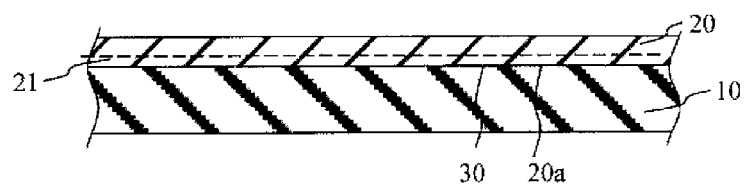
FIG. 1C is a partial cross-sectional view.

FIG. 1A is a plan view illustrating a schematic configuration of a composite substrate 1 according to one embodiment of the present invention. FIG. 1B is a partial cross-sectional perspective view of the composite substrate 1. FIG. 1C is a cross-sectional view of the composite substrate 1.

The composite substrate 1 is made from a support substrate 10 and a layered semiconductor part 20. The support substrate 10 and the semiconductor part 20 are made of different material groups. The support substrate 10 is a monocrystalline body. Monocrystalline aluminum oxide (sapphire), an insulating material such as silicon carbide, a piezoelectric material with a primary component of lithium tantalate, or the like can be used as the material to form the support substrate 10. In this embodiment, an insulating material is used as the support substrate 10. Specifically, a 6 inch R-plane sapphire substrate is used.

The semiconductor part 20 is a monocrystalline layer made of a semiconductor material. Si, GaN, GaAs, or the like can be used as the material to form the semiconductor part 20. Si is used in this example. One entire main face of the semiconductor part 20 is bonded with the support substrate 10.

Here, the semiconductor part 20 includes an interface region 21. The interface region 21 is defined as a 5 nm thick region of the semiconductor part 20 continuing from a bonding face 30 where the support substrate 10 and the semiconductor part 20 are in contact toward the semiconductor part 20. This interface region 21 contains any one of a metal made from a metal element excluding the main components (Al, Si) constituting the support substrate 10 and the semiconductor part 20 and an inert element selected from the group consisting of Ar, Ne, Xe, and Kr. This example describes the case of including Ar as the inert element. Examples of the above-described metal include Fe, Cr, Ni, Cu, and the like. Furthermore, the amounts of Ar and the metal are adjusted so that the number of Ar atoms per unit area is greater than the number of atoms per unit of the metal and less than the number of atoms per unit of the element constituting the semiconductor part 20.

Here, the number of atoms per unit area of the element constituting the semiconductor part 20 for this working example is $1.35 \times 10^{15}$ atoms/cm$^2$ when found from the amount to form one atomic layer of Si. If the semiconductor part 20 is a compound semiconductor, the value of the number of atoms would be the sum of the number of atoms per unit area for each element constituting the compound.

The number of atoms per unit area of metal, inert element (Ar), Si, and the like can be measured with Inductively Coupled Plasma Mass Spectrometry (ICP-MS), Secondary Ion Mass Spectrometry (SIMS), Total Reflection X-ray Fluorescence (TXRF), or the like. More specifically, the density of the metal atoms in the interface region 21 in the planar direction may be found by measuring the amount of metal atoms and the amount of Ar atoms by performing analysis in the depth direction using SIMS. If the number of metal atoms is below the SIMS detection limit, the density of the metal atoms in the planar direction may be found by dissolving a portion of the semiconductor part 20 on the support substrate 10 in a fixed volume of etching solution and measuring the amount of metal atoms with ICP-MS and assuming that the entire amount is present in the interface region 21 within a 5 nm thickness from the interface. Such an assumption is the result of observation and measurement of the distribution state of metal atoms and Ar atoms in the thickness direction for a plurality of composite substrates 1 according to the present embodiment. The results confirm that even if there is a large amount of metal, the metal is present within a 5 nm region (the interface region 21) of the semiconductor part 20 on the support substrate 10 side, and almost no metal diffuses to other regions. In addition, the abundance of each element may be distributed in the depth direction.

Note that the interface region 21 functions as a monocrystalline layer. That is, the interface region 21 maintains crystallinity without the crystallinity being significantly reduced compared to the remaining regions of the semiconductor part 20 or being changed to a polycrystalline layer or an amorphous layer. Such crystallinity can be confirmed, for example, from a TEM image by cross-sectional TEM observation in the thickness direction of the composite substrate 1 or by electron diffraction. However, a slight displacement of atom positions from an ideal position in the first to second atom layers closest to the bonding face 30 can be tolerated. In other words, a support substrate 10 crystal face and a semiconductor part 20 crystal face can be said to be in contact at the bonding face 30.

According to the composite substrate 1 for which the amount of inert element and the amount of metal are controlled in this way, the support substrate 10 and the layered semiconductor part 20 can be bonded by being in contact without a conventional intermediate layer or hybrid layer therebetween. This is described in detail below.

The intermediate layer or the hybrid layer works as an adhesive layer when bonding two members made of different materials and is necessary in order to achieve the bonding of both members. In contrast, a bonding method using a dangling bond formed by activating the surfaces of both the support substrate 10 and the semiconductor part 20 is proposed as a technique to bond these substrates using the Van der Waals' forces thereof without an accompanying chemical reaction or structural change.

However, when the support substrate 10 surface and the semiconductor part 20 surface are irradiated by an ion gun or a FAB gun in order to activate the same, the atoms constituting a crystal structure of the irradiation faces are displaced in accordance with the irradiation energy. For example, with a 100 eV energy irradiation, for a Si monocrystalline layer, displacement occurs in a layer of approximately 10 atoms. Energy irradiation in such an activation stage is presumed to be a cause for generation of an amorphous layer (hybrid layer).

In the same way, the inert element (Ar in this example) remains on the activated face due to the energy irradiation. In some cases, the residual inert element is supplied by being contained in the environment where the activation is performed, or by using an Ar ion gun, an Ar neutron gun, or the like (simply referred to as "gun" below) as the gun for activation. The residual amount and penetration depth depend on the irradiation conditions such as the amount of energy irradiation. In particular, if the inert element is supplied from a gun used for activation, the residual amount and penetration depth are strongly influenced by the irradiation conditions of the gun used for activation. Here, it is understood that Ar is the nucleus constituting the amorphous structure by remaining on the bonding face and is difficult to remove by way of subsequent thermal treatment or the like. In other words, when attempting to restore the surface of the semiconductor part 20, amorphized due to the activation, to the original crystalline structure by way of annealing, it is understood that displacement of the atoms to be restored to the original crystalline structure is inhibited by Ar when a large amount of Ar is present. Thus, amount of Ar must at most be equal to or be less than an amount to cover one atom layer of the element constituting the semiconductor part 20.

That is, when bonding the support substrate 10 and the semiconductor part 20 using the Van der Waals' forces of both in order to eliminate the intermediate layer or the hybrid layer, it is clear that there is concern that the so-called intermediate layer or hybrid layer is created by way of irradiation with or presence of Ar. Therefore, it was discovered that controlling the amount of Ar present is necessary.

Note that such phenomenon is particularly significant for Ar from among the inert elements, but a similar phenomenon can occur with other elements such as Ne and Xe.

On the other hand, metal may be deposited by this vacuum process or the like when irradiating with the ion gun or the FAB gun for bonding by activating the surfaces of the support substrate 10 and the semiconductor part 20. Furthermore, there is concern that such metal will diffuse or move from the bonding face to the semiconductor part 20 in which a semiconductor element is manufactured. In this case, functionality as a semiconductor element is affected and reliability is also reduced. Thus, it is useful to include Ar that has a strong capacity to perform gettering the metal in an amount that is no less than the amount of metal in order to inhibit the diffusion and movement of metal. Note that if the abundance of metal is greater than the amount of Ar, then there is new concern of an amorphous or a polycrystalline intermediate layer forming by the surplus metal mutually cohering in the bonding face. The presence of such an intermediate layer affects heat radiation, parasitic capacitance or the like. As described above, the amount of metal must be less than the amount of Ar in order to also prevent formation of an intermediate layer.

The abundance of such metal in the interface region 21 is preferably no more than $1 \times 10^{12}$ atoms/cm$^2$. More preferably, the abundance of metal is in the $10^{10}$ atoms/cm$^2$ range.

In this way, the result of repeated investigations by the inventors discovered that the amount of Ar and metal present must be controlled in order to bond different material types without interposing an intermediate layer or hybrid layer therebetween. That is, a bond between the support substrate 10 and the semiconductor part 20 can be achieved without interposing an intermediate layer or hybrid layer therebetween and the semiconductor part 20 can be maintained at a high quality by controlling the amount of Ar so that the amount is greater than the amount of the metal and less than the amount of the element constituting the semiconductor part 20. By way of such a configuration, a highly reliable composite substrate 1 can be provided by controlling the unintentional degradation of heat radiation or the occurrence of parasitic capacitance due to the presence of an intermediate layer or hybrid layer.

Modified Example: Material

Although the support substrate 10 and the semiconductor part 20 can be suitably and freely selected, the material constituting the support substrate 10 is preferably a material with a lower etching rate for dry etching than that of the material constituting the semiconductor part 20. The etching rate may be determined from actual measured values or literature values, or may be estimated from physical property values of the material such as ionization tendency.

If focusing on the energy of the FAB gun or the like to irradiate in order to perform dry etching, when a configuration such as that described above is used, the energy required for activating the surfaces of the support substrate 10 and the semiconductor part 20 to the same degree will be higher for the support substrate 10. Thus, the Ar irradiation on the semiconductor part 20 whereon the semiconductor element is formed can be reduced, and as a result, both the amount of displacement and the abundance of and depth of Ar can be controlled to be the required minimum value. Meanwhile, the impact on the semiconductor part 20 is small even if the abundance of Ar on the support substrate 10 side is large. In addition, formation of an intermediate layer or a hybrid layer can be more reliably suppressed by decreasing the concern of amorphization by occurrences of structural changes by the support substrate 10 being easily displaced.

Modified Example: Material

The surface of the material constituting the support substrate 10 is preferably stable at normal temperature. In this case, as described below, the generation of unnecessary inert element (Ar), floating material (metal, C, H, and the like) can be suppressed because bonding with the semiconductor part 20 is possible even when the degree of activation of the support substrate 10 is low. Thus, formation of an intermediate layer or hybrid layer can be suppressed more reliably in the bonding interface. Note that sapphire is an example of a material with a surface that is stable at normal temperature.

Modified Example: Amount of Ar

The upper limit for the amount of Ar is set to $1.35 \times 10^{15}$ atoms/cm$^2$ but is preferably $1 \times 10^{14}$ atoms/cm$^2$ or less. In this case, this is because the occurrence of lattice defects or the like in the semiconductor part 20 can be favorably suppressed. More preferably, the amount of Ar is $5 \times 10^{12}$ atoms/cm$^2$ or less. This is because there is concern of an amorphous portion being formed by Ar becoming the nucleus if the surplus Ar is greater than the amount of metal. Thus, the amount of metal is even more preferable less than $10^2$ atoms/cm$^2$.

(Method for Manufacturing Composite Substrates)

An embodiment of a method for manufacturing a composite substrate of the present invention is described with reference to the drawings.

(Preparing Step)

Figure 2A:
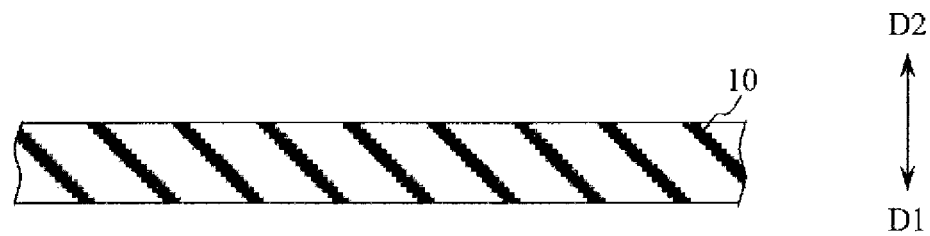
FIGS. 2A to 2C are cross-sectional views illustrating a manufacturing process of a method for manufacturing the composite substrate according to one embodiment of the present invention.

First, as illustrated in FIG. 2A, a support substrate 10 is prepared. The support substrate 10 uses a material different from the semiconductor part 20. In this example, the support substrate 10 is not particularly limited as long as a monocrystalline body is made from an insulating material, and can be exemplified by a sapphire substrate, for example.

Figure 2B:
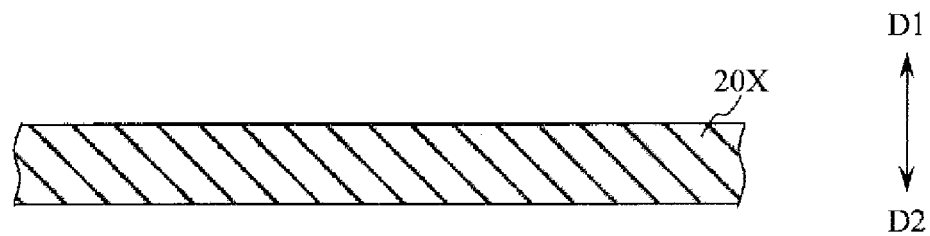

Next, as illustrated in FIG. 2B, a monocrystalline semiconductor base substrate 20X is prepared. In this example, a semiconductor base substrate 20X formed by silicon (Si) is prepared. The dopant concentration of the semiconductor base substrate 20X is comparatively high with, for example, a p-type dopant of no less than $1 \times 10^{18}$ atoms/cm$^3$ and no more than $1 \times 10^{21}$ atoms/cm$^3$.

Figure 2C:
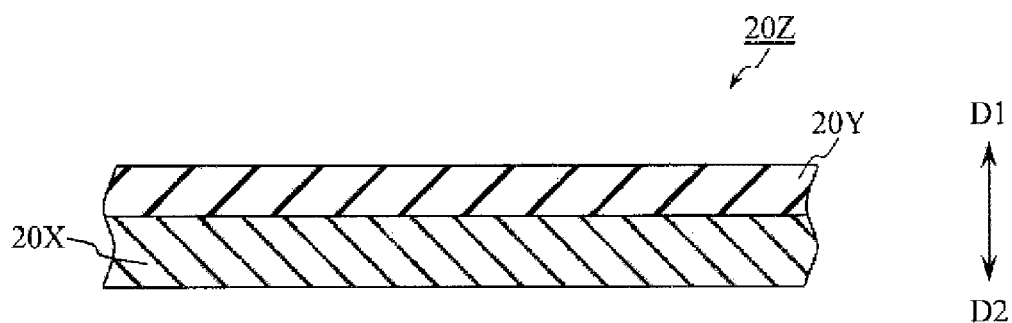

Next, as illustrated in FIG. 2C, a semiconductor layer 20Y is formed by subjecting silicon to epitaxial growth on a top face of the semiconductor base substrate 20X in the direction of arrow D1. Various methods can be used for this epitaxial growth method, methods such as thermal chemical vapor deposition (thermal CVD method) wherein growth is caused by a gaseous silicon compound passing over the surface of the semiconductor base substrate 20X and thermally decomposing while the semiconductor base substrate 20X is heated. Because the semiconductor layer 20Y is subjected to epitaxial growth on a silicon substrate, lattice defects can be fewer than epitaxial growth on a sapphire substrate.

A semiconductor layer 20Y with less dopant than the semiconductor base substrate 20X can be used. This semiconductor layer 20Y is formed so that the dopant concentration is gradually lower in the direction from the semiconductor base substrate 20X side toward the top face side. The top face portion of the semiconductor layer 20Y is formed so as to have either a relatively low concentration of dopant (less than $1 \times 10^{16}$ atoms/cm$^3$, for example) or be nondoped portion. Here, "nondoped silicon" simply refers to silicon not intentionally doped with impurities and is not limited to intrinsic silicon not containing any impurities. The semiconductor layer 20Y of the present embodiment is a p-type silicon and is formed so that the dopant concentration on the top face portion is low. The dopant concentration of this semiconductor layer 20Y can be controlled by regulating the amount of impurities supplied for epitaxial growth. A nondoped silicon can be formed by supplying no impurities. In addition, the dopant concentration may be gradually changed by way of reducing dopant diffusion for epitaxial growth.

In this way, a semiconductor substrate 20Z with a semiconductor layer 20Y formed on the semiconductor base substrate 20X is prepared.

(Activating Step)

Figure 3A:
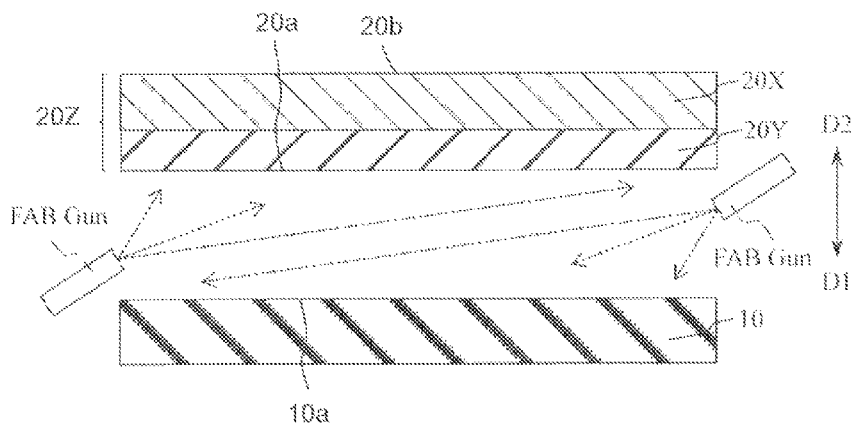
FIGS. 3A to 3C are cross-sectional views illustrating a manufacturing process after the manufacturing processes illustrated in FIGS. 2A to 2C.

Next, as illustrated in FIG. 3A, a main face 10a of the support substrate 10 and a main face 20a of the semiconductor substrate 20Z (the surface of the semiconductor layer 20Y) are activated by both main faces 10a, 20a being irradiated with a FAB gun. For example, a gun that irradiates an Ar neutral atom beam can be used as the FAB gun.

Here, differing the FAB gun irradiation energies for the support substrate 10 and the semiconductor substrate 20Z is preferable. For example, the energy of the FAB gun to irradiate the material with a higher etching rate for dry etching from among the material constituting the support substrate 10 and the material constituting the semiconductor substrate 20Z may be lower than the energy to irradiate the material with the lower etching rate. For a support substrate 10 made from sapphire and a semiconductor substrate 20Z made from Si, the energy of the FAB gun to irradiate the semiconductor substrate 20Z is set to be low. By setting in this manner, both the support substrate 10 and the semiconductor substrate 20Z can be activated to a surface state allowing bonding under optimal conditions tailored to both. Specifically, damage to the surface state can be reduced by suppressing the surplus energy irradiating the main face on the side made of the material with a higher etching rate. In addition, the bonding can be made more reliable by irradiating the main face on the side made of the material with a lower etching rate using the necessary and sufficient energy.

Although the energy difference for the FAB gun to irradiate the support substrate 10 and the semiconductor substrate 20Z can be regulated within a range to allow bonding, it is preferable to have conditions where etching (spattering) is possible only for the same thickness.

Here, it is know that FAB guns have high directionality. Thus, even if the main face 10a of the support substrate 10 and the main face 20a of the semiconductor substrate 20Z are activated at the same time, each can be irradiated individually by changing the irradiation conditions and the impact of the irradiation for one on the other can be suppressed.

In this example, although the main face 10a of the support substrate 10 is disposed opposite of the main face 20a of the semiconductor substrate 20Z, and a FAB gun corresponding to each is installed, and each are irradiated under independent conditions by installing a FAB gun corresponding to each and controlling these individually, but the present invention is not limited to this example. For example, a shared FAB gun may be provided for the main face 10a of the support substrate 10 and the main face 20a of the semiconductor substrate 20Z. Both main faces may be activated by displacing the irradiation angle of the FAB gun and changing the irradiation energy according to the angle. In addition, a separating plate may be provided between the main face 10a of the support substrate 10 and the main face 20a of the semiconductor substrate 20Z with the main faces disposed to face each other so that one of the main faces is not affected by activating the other main face, and the main faces may be separated temporally and spatially by moving one main face to a standby chamber while activating the other main face.

(Metal Supplying Step)

Figure 3B:
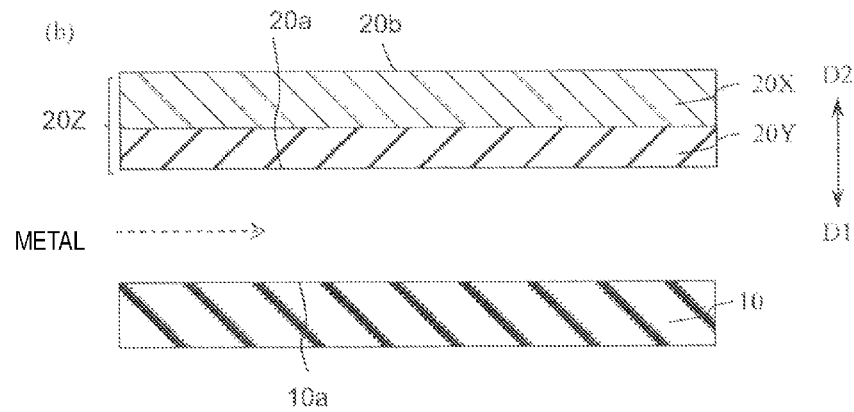

Next, as illustrated in FIG. 3B, metal is supplied to at least one of the activated main face 10a of the support substrate 10 and the activated main face 20a of the semiconductor substrate 20Z. The metal excludes the element constituting the main component of the support substrate 10 and the element constituting the main component of the semiconductor substrate 20Z. Specifically, in this example, the metal excludes Al and Si but may be exemplified by Fe, Cr, Ni, Cu, and the like.

Such metal may by supplied by being contained in a desired amount in the environment where the activation is performed and may be supplied in a desired amount by etching (spattering) a metal supplying body (such as a metal plate containing Fe or the like) disposed in the environment where the activation is performed. The FAB gun may be used for etching, similar to the activating step. Note that the metal supplying step may be performed simultaneously with the activating step or subsequent to the activating step.

(Inert Element Supplying Step)

Figure 3C:
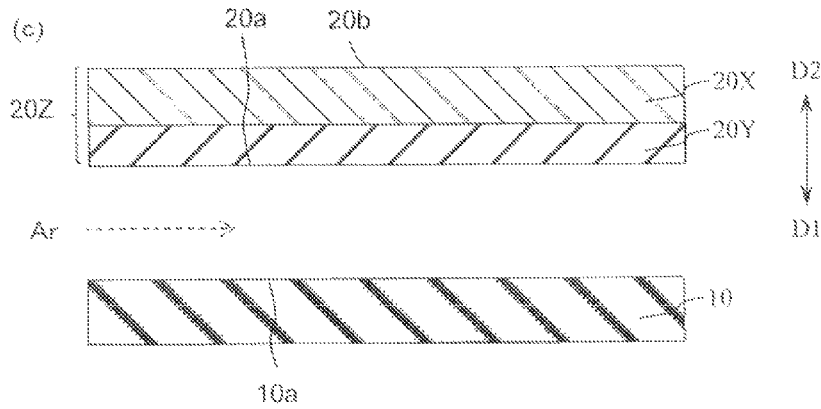

Next, as illustrated in FIG. 3C, the inert element is supplied to at least one of the activated main face 10a of the support substrate 10 and the activated main face 20a of the semiconductor substrate 20Z. The inert element can be selected from the group consisting of Ar, Ne, Xe, and Kr. In this example, Ar is supplied as the inert gas. When comparing the number of atoms per unit area, the number of Ar atoms per unit area is greater than the number of atoms per unit area of the above-described metal and less than the number of atoms per unit area of the atoms constituting a crystal face exposed to the main face 20a of the semiconductor substrate 20Z.

Such Ar may be contained in a desired amount in the environment where the activation is performed, and Ar may be emitted from a FAB gun or an ion gun. In particular, it is preferable to perform this step simultaneously with the activating step by setting the FAB gun irradiation conditions during the activating step so that both the main face 10a of the support substrate 10 and the main face 20a of the semiconductor substrate 20Z are activated to a desired state and the amount of Ar is the amount described above. At this time, Ar neutral atoms must be used for the FAB gun. At this time, the metal supplying step may be performed simultaneously.

Note that if the FAB gun irradiation energy is large, Ar is made to penetrate to a deeper thickness position from both main faces 10a, 20a and a large amount is contained toward the interior from both main faces 10a, 20a. Thus, it is preferable to use a FAB gun that can reduce the energy reaching both main faces 10a, 20a to no more than ¹⁄₂₀ of the case when using an ion gun for activation. In addition, the amount of metal can be reduced by using a FAB gun with high directionality.

(Bonding Step)

Figure 4A:
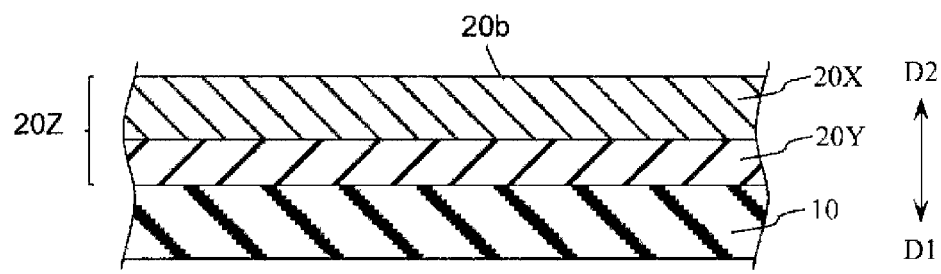
FIGS. 4A to 4C are cross-sectional views illustrating a manufacturing process after the manufacturing processes illustrated in FIGS. 3A to 3C.

Next, as illustrated in FIG. 4A, both the main face 10a of the support substrate 10 and the main face 20a of the semiconductor substrate 20Z having been activated and supplied with metal or Ar are brought into contact under normal temperature and then bonded. Normal temperature means room temperature, however normal temperature refers to no active heating and allows temperature increase due to the activating step and the bonding step. Specifically, normal temperature includes temperatures of no less than 10° C. and no more than 150° C.

During this bonding step, a predetermined amount of metal and Ar is contained between the main face 10a of the support substrate 10 and the main face 20a of the semiconductor substrate 20Z.

(Thinning Step)

Figure 4B:
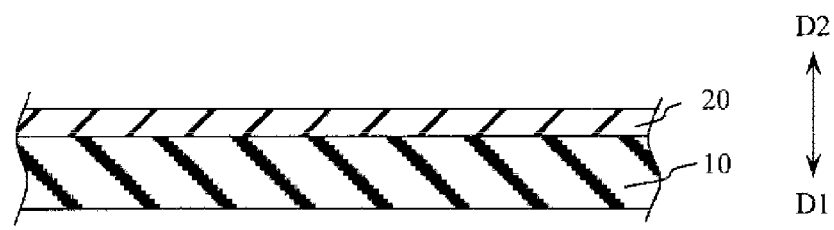

Next, as illustrated in FIG. 4B, the semiconductor substrate 20Z is made into a layered semiconductor part 20 by thinning the semiconductor substrate 20Z from the D2 direction of the semiconductor substrate 20Z (from a second main face 20b in FIG. 4A).

Specifically, the thickness of the semiconductor base substrate 20X is first made thinner. Various methods, such as abrasive polishing, chemical etching, or ion beam etching, can be used to thin the thickness, and a combination of multiple methods may also be used.

Next, the semiconductor layer 20Y thickness is thinned along with the thinned semiconductor base substrate 20X by etching the thinned semiconductor base substrate 20X with an etching solution after polishing. This etching is possible by using a selective etching solution, with differences in dopant concentration varying the etching speed greatly. Examples of the selective etching solution include a mixture of hydrofluoric acid, nitric acid, and acetic acid, and a mixture of hydrofluoric acid, nitric acid, and water. This embodiment uses a mixture of hydrofluoric acid, nitric acid, and acetic acid as the etching solution. The present embodiment uses a p-type silicon, and this etching solution is regulated by setting dopant concentration boundaries to be from $7\times10^{17}$ atoms/cm$^3$ to $2\times10^{18}$ atoms/cm$^3$ so that the etching speed is significantly reduced. Note that examples of other methods for selective etching include an electrolytic etching method in an approximately 5% hydrofluoric solution, and an anodically oxidization method of pulsed voltage using a KOH solution. This semiconductor layer 20Y is etched to the middle of the transitional region in which the dopant concentration gradually changes. Here, the semiconductor layer 20Y whose thickness is thinned by etching is the semiconductor part 20. The thickness of this semiconductor part 20 is, for example, in the range of several nm to approximately 2 μm.

(Heating Step)

Figure 4C:
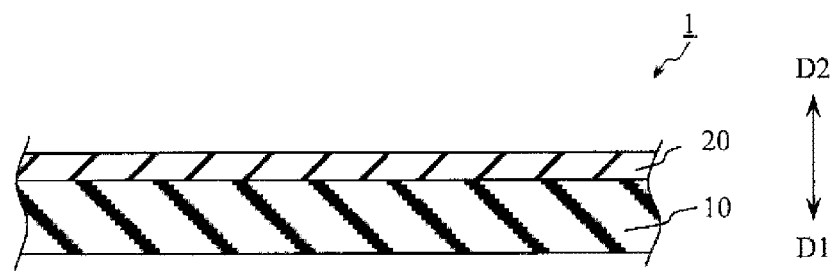

Next, a composite substrate 1 with the semiconductor part 20 layered on the top face of the support substrate 10 in the direction of the arrow D2, as illustrated in FIG. 1, can be manufactured by heating the bonded semiconductor part 20 and the support substrate 10, as illustrated in FIG. 4C, to a temperature higher than the eutectic temperature of the metal and the material constituting the semiconductor part 20. Specifically, the example of Fe being selected as the metal and Si being selected as the element constituting the semiconductor part 20 is described. Fe is selected as the example because Fe is most often included in experimental results, moves easily, has a high likelihood of affecting operation of a semiconductor element manufactured in the semiconductor part 20. When Fe and Si are heated, a plurality of phases are formed by a reaction starting from 470° C. For example, the eutectic isotherm for Fe$_2$Si is 825° C.

However, this figure is for the bulk state, and the temperature may shift to the lower temperature side than the theoretical value for this example with a very thin semiconductor part 20, a non-rigid bond at the bonding face 30, and underlying dangling bonds and the like.

In consideration of this point, 500° C. is the target temperature for heating Fe and Si. In addition, the target temperature may be the aggregation onset temperature for Fe and Si, and may also be a temperature at which a diffusion coefficient of Fe in Si is greater by a certain amount ($5\times10^2$ for example) than the value at normal temperature. In addition, the upper limit of the temperature preferably does not exceed the heat processing temperature generally considered in the manufacturing of the semiconductor element in a material group constituting the semiconductor part 20. The reason for this is to suppress occurrences of unintentional thermal stress and thermal distortion. Specifically, a temperature of no more than 1800° C. is preferably if the semiconductor is Si-based.

Furthermore, heating at the above temperature continues for an amount of time required for the Si atoms in the amorphized interface region to return to original positions and for the movement and immobilization reactions due to Fe and Ar diffusion to complete. This heating time also depends on the heating temperature, the area of the bonding face 30 of the support substrate 10 and the semiconductor part 20, and the like, but may be set to approximately from 15 to 60 minutes.

In this way, the Fe atoms are immobilized and the residual Si can be restored to a monocrystalline crystal array by returning to the original atomic positions by way of heating for a fixed time in a state in which both the Si atoms and the Fe atoms can move and be alloyed.

By undergoing such a process, the Ar contained in a predetermined amount can be immobilized in the bonding interface by reacting with the metal. Furthermore, the atoms (Si atoms in this case) constituting the semiconductor part 20 displaced during the activating step can be restored to a lattice position constituting the original monocrystalline by reducing the independently present Ar. In this way, recovery of the crystallinity on the bonding face 30 side of the semiconductor part 20 can be first achieved when the bonding face after the bonding step can be a non-rigid bonding, the amount of impurities (Ar, metal, and the like) contained can be such that a hybrid layer or intermediate layer is not formed, and the amount of Ar as well as the amount of Si atom displacement during activation can be suppressed. Note that the following two points are considered as reasons why the bonding state after the step of bonding must not be rigid and have a certain degree of freedom. First, the bonding is not accompanied by a chemical reaction. Next, in order to bond materials of different types, an inconsistency occurs in the number of dangling bonds generated in the activating step and this inconsistency causes the dangling bonds to persist in the bonding face even after the bonding step.

Note that such a heating step can be first achieved after thinning the semiconductor substrate 20Z. This is because peeling or damage occurs due to a thermal expansion differential between the support substrate 10 and the semiconductor substrate 20Z if heating is performed before the thinning step.

The composite substrate 1 illustrated in FIG. 1 can be manufactured by performing the above steps.

Modified Example: Activating Step

In the activating step in the above example, the example of using the FAB gun is described, but an ion gun can be also used in the activating step. In this case, damage to the main face 20a of the semiconductor substrate 20Z is suppressed by regulating the energy of the ion gun. In particular, when using Ar ions as the ions for the ion gun, the irradiation energy and irradiation time are regulated so that the amount of Ar contamination because of ion gun irradiation is no more than the upper limit of the desired range for the amount of Ar.

Note that the irradiation energy for the support substrate 10 and for the semiconductor substrate 20Z can be made different by activating in circumstances in which the support substrate 10 and the semiconductor substrate 20Z are separated temporally or spatially even when the ion gun is used.

In addition, the amount of metal contamination tends to increase when using the ion gun. Here, the amount of metal contamination must be suppressed when using the ion gun by removing metal atoms floating in the activation environment and by forming the members exposed to the activation environment from hardly etchable material.

As described above, when focusing on the number of atoms per unit area, the ion gun can be used by suppressing the amount of Ar contamination and the amount of metal contamination so that the number of Ar atoms per unit area is greater than the number of atoms per unit of the metal and is less than the number of atoms per unit of the atoms constituting the crystal face exposed to the main face 20a of the semiconductor substrate 20Z.

Modified Example: Activating Step

The example above describes the case in which the main face 10a of the support substrate 10 and the main face 20 of the semiconductor substrate 20Z (the surface of the semiconductor layer 20Y) are activated by both main faces 10a, 20a being irradiated simultaneously with a FAB gun while facing each other, but the present invention is not limited to this. Furthermore, the example of both main faces 10a, 20a being activated to the same degree is described, but the present invention is also not limited to this.

For example, activation is possible without the main faces facing each other by activating the support substrate 10 and the semiconductor substrate 20Z in circumstances separated temporally or spatially. The amount of metal contamination can be reduced by such a process.

Furthermore, the present inventors, through repeated experimentation, discovered that the degree of activation required for bonding is different for the support substrate 10 and the semiconductor substrate 20Z. The reason for this difference is unclear, but the following mechanisms can be considered. First, semiconductor substrates 20Z can easily be bonded together by mutually activating the surfaces. However, bonding different types of material such as the semiconductor substrate 20Z and the support substrate 10 made of sapphire is difficult. Thus, bonding is achieved by including metal at the bonding interface. In addition, even though it is the same material, bonding sapphire substrates together by activating the surfaces thereof is difficult. From these phenomena, it is thought that articles made from materials having stable surface states at normal temperature are difficult to activate. From this, it is thought that when bonding the support substrate 10 and the semiconductor substrate 20Z, the degree of activation of the other material has a greater impact when bonding than the degree to which one material is activated.

Here, the support substrate 10 is an insulating substrate and the surface state thereof is stable at normal temperature. Thus, the degree of activation of the semiconductor substrate 20Z, which is the bonding partner of the support substrate, is important. That is, the degree of activation of the semiconductor substrate 20Z is preferably greater than the degree of activation of the support substrate 10. More specifically, bonding is achieved by requiring the degree of activation of the semiconductor substrate 20Z to be equal to or greater than the degree of activation used in general normal temperature bonding methods, and conversely the degree of activation of the support substrate 10 can significantly less than the degree of activation used in general normal temperature bonding methods. This was confirmed by repeating bonding experiments after activating by changing the degree of activation of the support substrate 10 and the semiconductor substrate 20Z individually. Here, "degree of activation" can be inferred from the output or accumulated irradiation time of the FAB gun, the distance between the FAB gun and the surface of the item to be irradiated, and the like.

Based on the findings above, in this example, the activation process is divided into a first activating step and a second activating step. That is, at least the main face 20a of the semiconductor substrate 20Z is activated in the first activating step. At this time, activation is performed by irradiating with a FAB gun while maintaining a state in which the main face 20a of the semiconductor substrate 20Z is not facing the main face 10a of the support substrate 10.

Thus, even when irradiating with a FAB gun under the general intensity and time conditions required for bonding with an ordinary normal temperature bonding device, floating material from etching accompanying the FAB gun irradiation does not adhere to the main face 10a of the support substrate 10.

Next, the second activating step is performed. The second activating step activates the main face 10a of the support substrate 10 by irradiating with a FAB gun under conditions such that the accumulated irradiation energy is less than that of the FAB gun irradiation in the first activating step. Here, the energy from the FAB gun that actually reaches the surface to be activated (main face 10a) is different than the value for the FAB gun irradiation conditions. However, the energy from the FAB gun that actually reaches the surface to be activated is dependent on the product of the acceleration voltage and the irradiation time. Thus, in the description below, the product of the acceleration voltage and irradiation time is defined as the accumulated irradiation energy estimated value (also referred to simply as the accumulated irradiation energy). Specifically, the accumulated irradiation energy in the second activating step is defined as a value between the accumulated irradiation energy required to remove the carbon and hydrogen adsorbed on the main face 10a of the support substrate 10 (second value) and the accumulated irradiation energy under general activation conditions (first value) and is defined as a value closer to the second value. More specifically, this value is defined as a value equal to the second value or exceeds the second value slightly. For example, it is confirmed that a high bonding strength can be achieved by setting the acceleration voltage of the irradiation FAB gun for the second activating step to approximately ⅓ to ⅔ of irradiation in the first activating step and the irradiation time to approximately 1/10 to ⅓ of the irradiation in the first activating step.

The FAB gun irradiation conditions required for bonding can be adjusted by activating the main face 10a of the support substrate 10 in the second activating step. That is, the activation conditions can be made different than the activation conditions for the main face 20a of the semiconductor substrate 20Z. Thus, generation of unnecessary floating material from etching can be suppressed and the abundance of metal can be suppressed.

Here, the first activating step and the second activating step may be performed simultaneously, and the second activating step may be performed after the first activating step. In this example, the second activating step is performed following the first activating step.

Thus, even if the floating material from etching generated during the first activating step should reach the main face 10a of the support substrate 10, the floating material from the etching is not easily adsorbed because the main face 10a is not activated due to the first activating step being temporally separating from the second activating step. In addition, even if floating material from etching is to be adsorbed onto the main face 10a, the adsorbed material can be removed from the main face 10a during the subsequent second activating step. Thus, unnecessary interposing material can be prevented from contaminating the interface.

Furthermore, the main face 20a of the semiconductor substrate 20Z activated in the first activating step is exposed in an activated state inside a vacuum chamber. Thus, floating material in the vacuum chamber can be easily deposited (adsorbed) on the activated main face 20a of the semiconductor substrate 20Z. Thus, in the second activating step, a process of bonding the main face 20a of the semiconductor substrate 20Z and the main face 10a of the support substrate 10 may be performed after removing deposited material on the surface by irradiating the main face 20a of the semiconductor substrate 20Z with the FAB gun again under the same conditions as the irradiation of the main face 10a of the support substrate 10. Thus, bonding is possible by suppressing the amount of impurities or the amount of interposing material in the interface. Specifically, it is confirmed that no more than 100 impurity particles with a size from 0.12 to 0.5 μm are deposited on the face of the main face 20a by way of irradiating the main face 20a of the semiconductor substrate 20Z during the second activating step in this way. Note that in normal temperature bond methods, no less than 1000 impurity particles are deposited when bonding the main face 10a of the support substrate 10 and the main face 20a of the semiconductor substrate 20Z by activating the same with ordinary irradiation energy.

In addition, a favorable bonding strength can be ensured by irradiating the main face 20a of the semiconductor substrate 20Z with the FAB gun again in the second activating step. There was concern that if only the main face 10a of the support substrate 10 were to be irradiated with the FAB gun in the second activating step, then spattered atoms would float in the vacuum chamber and be deposited again on the main face 20a of the activated semiconductor substrate 20Z and reduce the bonding strength. This is prominent when time passes after activation until bonding of the main faces. Thus, in particular, irradiating the main face 20a of the semiconductor substrate 20Z again with the FAB gun in the second activating step is effective when achieving a non-facing state by temporal separation when activating the two surfaces to be activated in a non-facing state. Furthermore, the irradiation conditions for the FAB gun for the second irradiation have a smaller acceleration voltage and a shorter irradiation time than the first irradiation. This is to suppress an increase in the metal atoms on the main face 20a to be bonded by new spattering of the constituent material containing the metal by way of the second irradiation. Thus, even if the second irradiation of the FAB gun is under conditions of a smaller acceleration voltage, this is sufficient for reactivation of a surface that has already been activated. That is, the degree of activation of the main face 20a can be improved by forming dangling bonds by cutting the atomic bonds in the main face 20a of the semiconductor substrate 20Z in the first irradiation with the FAB gun and then only removing the carbon (C), hydrogen (H), and the like deposited in the dangling bonds with the second irradiation.

Note that, in the second activating step, the second irradiation by the FAB gun may be performed with the main face 10a of the support substrate 10 facing the main face 20a of the semiconductor substrate 20Z. Even in this case, because the accumulated irradiation energy estimated by the product of the FAB gun acceleration voltage and irradiation time is smaller for the second irradiation than for the first irradiation, bonding is possible with a small amount of metal atoms present on the surface to be bonded. For example, it is confirmed that a high bonding strength can be achieved and an effect of reducing the amount of metal atoms on the main face 20a be maintained by setting the acceleration voltage of the irradiation FAB gun for the second irradiation to approximately ⅓ to ⅔ of the irradiation in the first irradiation and the irradiation time to approximately 1/10 to ⅓ of the irradiation in the first irradiation.

Of course, FAB gun irradiation in the second irradiation process may be performed with the main faces not mutually facing. Even in this case, the activated main faces can be mutual bonded immediately after activation by setting the time for the second irradiation with the FAB gun to 1/10 to ⅓ of the time for the first irradiation.

Modified Example

In the above example, there was no particular limit provided for the time from activation of the main face 10a of the support substrate 10 and the main face 20a of the semiconductor substrate 20Z in the activating step until the bonding of both main faces 10a, 20a mutually in the bonding step, but the time between the activation of both main faces 10a, 20a until the bonding is preferably within 5 minutes. The bond strength decreases as time passes.

Note that the bond strength when bonding the main face 10a of the support substrate 10 with the main face 20a of the semiconductor substrate 20Z immediately after FAB gun irradiation is approximately 30 MPa. In contrast, the bond strength when bonding 5 minutes after FAB gun irradiation experienced a major decrease to approximately 1 to 5 MPa.

EXAMPLES

In accordance with the above method for manufacturing the composite substrate 1, working examples 1 to 3 of the composite substrate were manufactured by varying the irradiation energy of the FAB gun in the activating step as described below. Note that the following experimental conditions describe the values using a format of acceleration voltage (kV)/irradiation time (minutes) for the FAB gun.
Working example 1: 1.0/1.0
Working example 2: 1.8/1.0
Working example 3: 1.8/5.0

In addition, an activated comparative example was manufactured by irradiating with an ion gun rather than a FAB gun. Here, irradiation with the ion gun was under normal conditions without controlling the amount of metal and the amount of Ar. The irradiation energy of the ion gun was set to 100 eV.

Note that in the working examples 1 to 3 and the comparative example, the heating step was implemented as a 20 minute heating process at 1000° C., higher with respect to the reaction starting temperature of Si and Fe of 470° C. and the eutectic temperature of 825° C.

For the working examples 1 to 3 manufactured in this way, the amount of metal atoms and the amount of Ar atoms on the surface of the support substrate 10 (sapphire substrate) after FAB gun irradiation was measured by total reflection X-ray fluorescence (TXRF). In addition, for working example 3, the main face 20a of the semiconductor substrate 20Z after activation was measured in the same way with TXRF. The results are showed in table 1. Note that the TXRF analysis conditions are as described below.
Device name: Technos TREX630
Measurement Conditions
X-ray output: voltage, 40 kV, current, 40 mA
Angle of incidence: 0.05°
Accumulated time: 500 sec irradiation and the measurement data by SIMS and ICP-MS after bonding was compared and has been confirmed to be consistent.

In addition, the result of performing the measurement in the same way for the comparative example was that the amount of metal atoms was at a level of $10^{14}$ atoms/cm$^2$, the amount of Ar atoms was no more than $10^{12}$ atoms/cm$^2$, and the amount of Ar atoms satisfied the condition of being less than the number of atoms constituting the Si crystal face but the relationship with the amount of metal atoms was opposite to the working examples.

Next, a cross-sectional TEM image was observed by removing a cross section near the bonding face for the working example 3 and the comparative example by way of ion milling and focused ion beam (FIB) processing. The results are illustrated in FIGS. 5 and 6.

Figure 5:
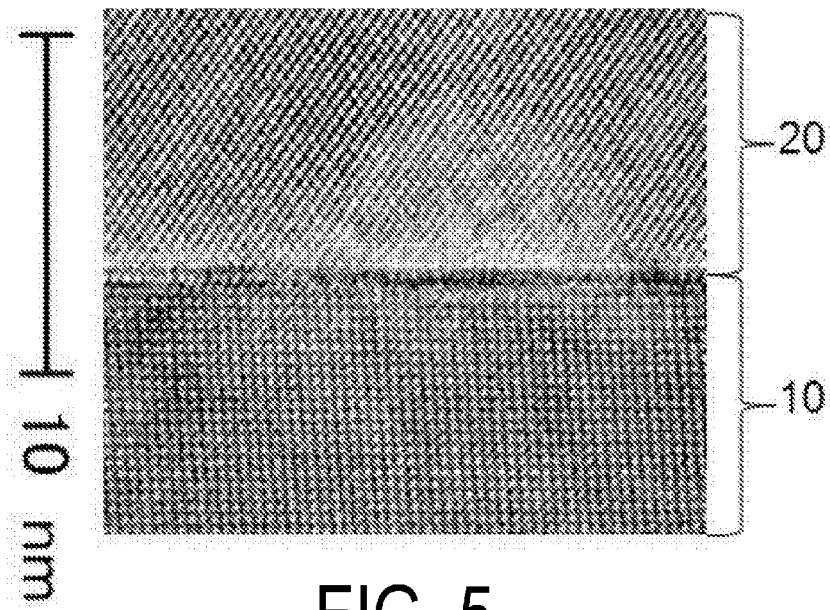
FIG. 5 is a cross-sectional transmission electron microscope (TEM) image of the composite substrate according to a working example.

FIG. 5 is a cross-sectional TEM image relating to the working example 3. FIG. 6 is a cross-sectional TEM image relating to the comparative example. As is clearly illustrated in FIG. 5, no intermediate layer or hybrid layer is present in the interface and a crystal face of the support substrate 10 and the semiconductor part 20 can be confirmed to be in contact in the working example 3. In addition, a slight displacement in the atomic layer exposed to the bonding face 30 of the semiconductor part 20 is observed, but no disturbance such that the lattice image is unclear is present. It can be confirmed that crystallinity is also maintained in the interface region 21.

Figure 6:
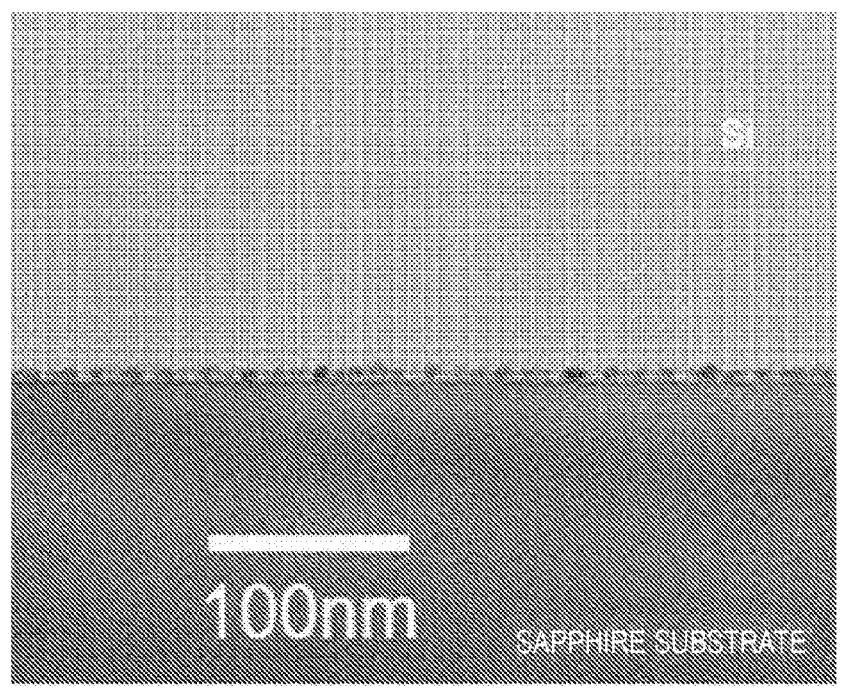
FIG. 6 is a cross-sectional TEM image of the composite substrate according to a comparative example.

Meanwhile, as is clearly illustrated in FIG. 6, the generation of an intermediate layer in the interface can be confirmed in the comparative example. This indicates that there is an abundance in the amount of metal and the amount of Ar and that crystallinity could be recovered by the thermal treatment. Note that the reason for the intermediate layer forming as an island is thought to be due to excess metal and Ar causing aggregation. Note that the magnification in FIG. 6 is different than in FIG. 5 in order to clearly illustrate the amount of intermediate layer present.

Figure 7:
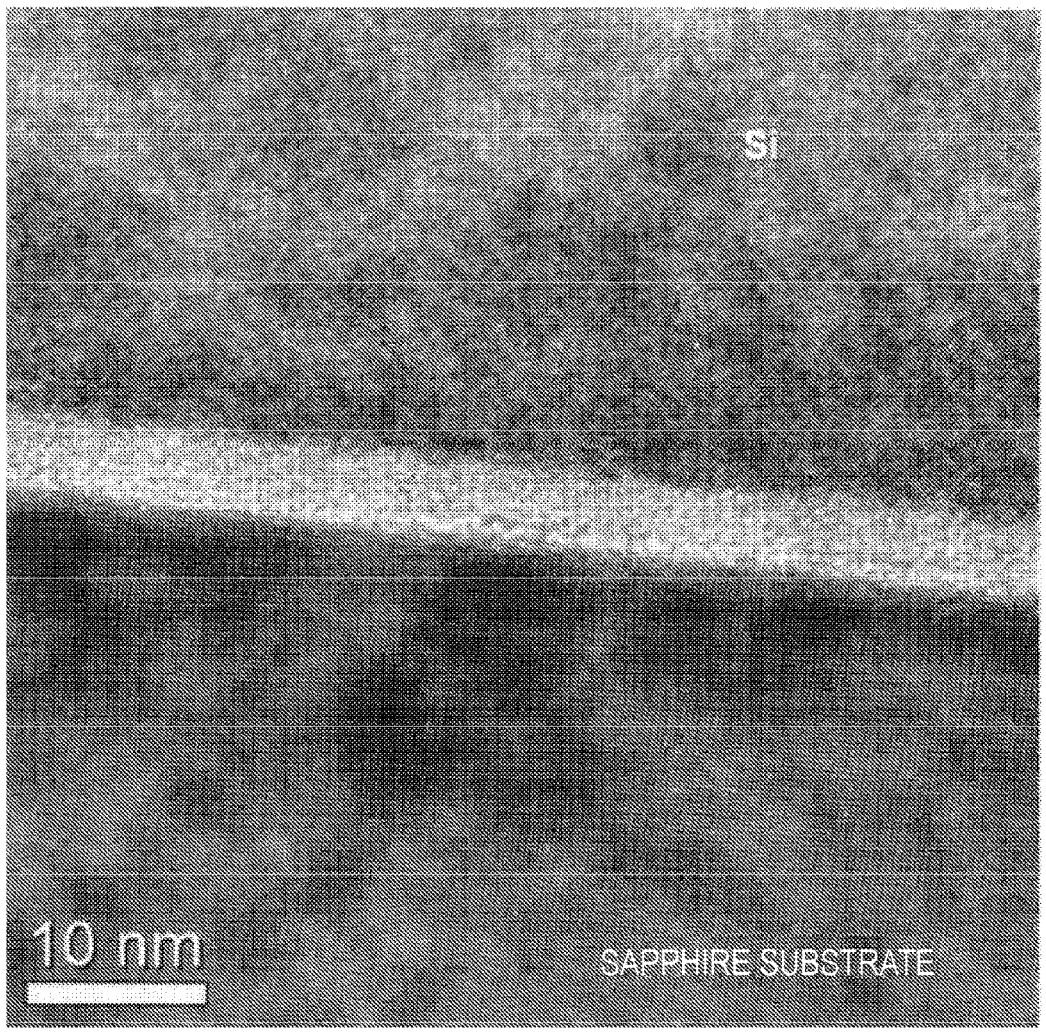
FIG. 7 is a cross-sectional TEM image during the manufacturing of a composite substrate according to a working example.
Figure 8:
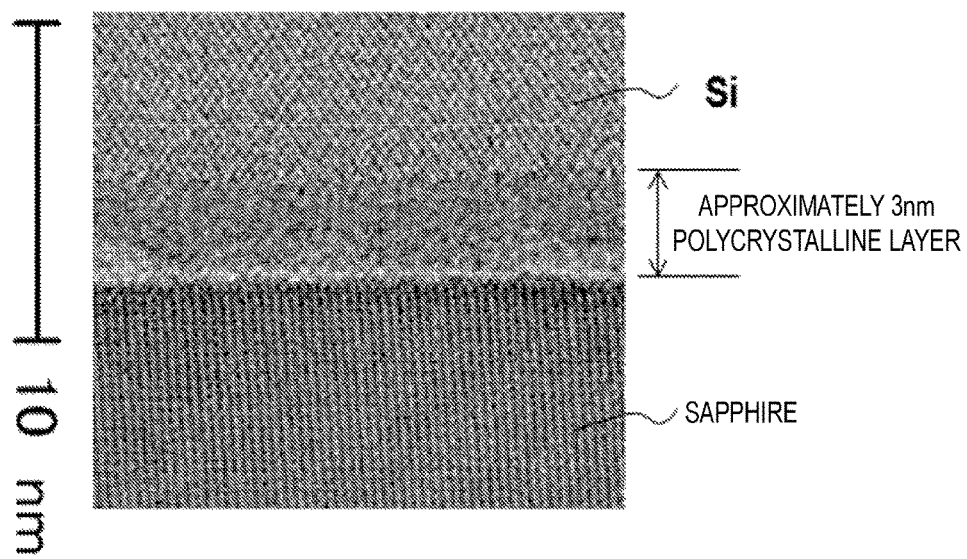
FIG. 8 is a cross-sectional TEM image during the manufacturing of a composite substrate according to a comparative example.

Note that FIGS. 7 and 8 illustrate the results of observing the cross-sectional TEM image of the working example 3 and the comparative example before performing the step of

TABLE 1

| | | V, kV | T, min | S | Cl | Ar | K | Ca | Ti | Cr | Mn | Fe | Co | Ni | Cu | Zn |
|---|---|---|---|---|---|---|---|---|---|---|---|---|---|---|---|---|
| Working Example 1 | Support Substrate Side | 1.0 | 1.0 | 26 | 29 | 91 | — | 6.5 | — | — | — | 1.1 | — | — | 2.7 | — |
| Working Example 2 | Support Substrate Side | 1.8 | 1.0 | 38 | 28 | 350 | — | — | — | — | — | — | — | — | — | — |
| Working Example 3 | Support Substrate Side | 1.8 | 5.0 | 42 | 44 | 400 | — | — | — | — | — | — | — | — | — | — |
| | Semiconductor Substrate Side | 1.8 | 5.0 | 34 | 16 | 570 | — | — | — | — | — | 0.8 | — | — | — | — |

×$10^{10}$ atoms/cm$^2$

As showed by the results in table 1, it was confirmed for the working examples that the amount of Ar atoms is greater than the amount of metal atoms and less than the number of atoms constituting the Si crystal face.

Note that the measurement data for the amount of metal atoms and the amount of Ar atoms by way of TXRF of the main face 10a of the support substrate 10 and the main face 20a of the semiconductor substrate 20Z after FAB gun heating. In the stage before heating, Si is displaced by the influence of the energy irradiation from the FAB gun or the ion gun, and the amorphous layer is known to exist.

From this, it could be confirmed that the crystallinity of the semiconductor part 20 was first restored by heating after controlling the amount of metal atoms and the amount of Ar atoms. In addition, it could be first confirmed that a hybrid layer or an intermediate layer did not occur between the semiconductor part 20 and the support substrate 10 by controlling the amount of metal atoms and the amount of Ar atoms.

From the above, it could be confirmed that for the composite substrate 1 of the working examples, a hybrid layer or the like is not present on the bonding face and a state of being directly bonded could be achieved in a real sense.

REFERENCE NUMBER

1 Composite substrate
10 Support substrate
10a Main face
20 Semiconductor part
20a Main face
21 Interface region
30 Bonding face

What is claimed is:

1. A composite substrate comprising:
a monocrystalline support substrate made of an insulating material;
a monocrystalline semiconductor part disposed on a top face of the support substrate; and
a 5 nm thick interface region formed in the monocrystalline semiconductor part and bonded to a bonding face of the support substrate, the 5 nm thick interface including,
a metal that is made from a metal element excluding materials constituting each main component of the support substrate and the semiconductor part; and
an inert element selected from the group consisting of Ar, Ne, Xe, and Kr, and
wherein a number of atoms per unit area of the inert element is greater than that of the metal and is smaller than that of an element constituting the monocrystalline semiconductor part.

2. The composite substrate according to claim 1, wherein a crystal face of the support substrate and a crystal face of the monocrystalline semiconductor part are in contact at the bonding face.

3. The composite substrate according to claim 1, wherein the monocrystalline support substrate comprises a material that has an etching rate for dry etching that is lower than that of the material constituting the semiconductor part.

4. The composite substrate according to claim 1, wherein the monocrystalline support substrate is made of sapphire and the semiconductor part is made of Si.

5. The composite substrate according to claim 1, wherein the number of atoms per unit area of the metal is no more than $10^{12}$ atoms/cm$^2$ and that of the inert element atoms is no more than $5\times10^{12}$ atoms/cm$^2$.

6. A method for manufacturing the composite substrate according to claim 1, comprising the steps of:
preparing the monocrystalline support substrate made from the insulating material, and the monocrystalline semiconductor substrate made from a material with an etching rate for dry etching that is different from that of the support substrate;
activating a main face of the support substrate and a main face of the monocrystalline semiconductor substrate by irradiating both main faces with a FAB gun;
supplying the metal to at least one of the activated main face of the monocrystalline support substrate and the activated main face of the monocrystalline semiconductor substrate, the metal made from the metal element excluding each main component of material constituting the monocrystalline support substrate and the semiconductor substrate;
supplying the inert element selected from the group consisting of Ar, Ne, Xe, and Kr, in an amount such that the number of atoms per unit area is greater than that of the metal and is less than that of the atoms constituting a crystal face exposed to the main face of the monocrystalline semiconductor substrate, to at least one of the activated a main face of the support substrate and the activated main face of the semiconductor substrate;
bonding the monocrystalline semiconductor substrate main face that has been activated and to which the metal or the inert element has been supplied and the monocrystalline support substrate main face that has been activated and to which the metal or the inert element has been supplied by being brought into contact under normal temperatures;
thinning the monocrystalline semiconductor substrate into a layered semiconductor part by thinning the semiconductor substrate from another main face of the semiconductor substrate; and
heating the layered semiconductor part and the support substrate at a higher temperature than a eutectic temperature of the metal and the material constituting the layered semiconductor part.

7. The method according to claim 6, wherein the step of activating, the step of supplying the metal, and the step of supplying the inert element are performed simultaneously.

8. The method according to claim 6, wherein during the step of activating, an energy of the FAB gun to irradiate the main face of the monocrystalline support substrate and the main face of the monocrystalline semiconductor substrate is set for the substrate made of a material that has a higher etching rate for dry etching out of the monocrystalline support substrate and the monocrystalline semiconductor substrate to be lower than for the one made of the material with a lower etching rate for dry etching.

9. The method according to claim 6, wherein in the step of preparing, the monocrystalline support substrate is prepared, the monocrystalline support substrate being made from a material with an etching rate for dry etching that is lower than that of the material constituting the layered semiconductor part.

10. The method according to claim 6, wherein in the step of activating, the main face of the monocrystalline semiconductor substrate is activated in a state of not facing the main face of the support substrate.

11. The method according to claim 6, wherein the step of activating includes the steps of:
first activating of the main face of the monocrystalline semiconductor substrate by irradiating with the FAB gun while in a state of not facing the main face of the monocrystalline support substrate; and
second activating of the main face of the monocrystalline support substrate by irradiating with the FAB gun under conditions such that an accumulated irradiation energy is smaller than that of the FAB gun irradiation during the step of first activating.

12. The method according to claim 6 wherein in the step of activating, the main face of the monocrystalline semiconductor substrate is activated in a state of facing the main face of the support substrate.

13. The method according to claim 6, wherein the step of activating includes the steps of:

first activating of the main face of the monocrystalline semiconductor substrate by irradiating with the FAB gun; and second activating of the main face of the monocrystalline support substrate by irradiating with the FAB gun under conditions such that an accumulated irradiation energy is smaller than that of the FAB gun irradiation during the step of first activating.

* * * * *